United States Patent
Nagasawa (10) Patent No.: US 7,164,187 B2
(45) Date of Patent: Jan. 16, 2007

(54) SEMICONDUCTOR AND SEMICONDUCTOR SUBSTRATE, METHOD OF MANUFACTURING THE SAME, AND SEMICONDUCTOR DEVICE

(75) Inventor: Hiroyuki Nagasawa, Tama (JP)

(73) Assignee: Hoya Corporation, Tokyo (JP)

( * ) Notice: Subject to any disclaimer, the term of this patent is extended or adjusted under 35 U.S.C. 154(b) by 284 days.

(21) Appl. No.: 10/729,983

(22) Filed: Dec. 9, 2003

(65) Prior Publication Data

US 2004/0164380 A1    Aug. 26, 2004

(30) Foreign Application Priority Data

Dec. 16, 2002    (JP)    ............... 2002-364009

(51) Int. Cl.
*H01L 29/30*    (2006.01)
(52) U.S. Cl. .................. 257/617; 438/471; 117/106
(58) Field of Classification Search ............... None
See application file for complete search history.

(56) References Cited

U.S. PATENT DOCUMENTS 6,416,578 B1    7/2002    Nakano et al.
6,475,456 B1    11/2002    Nakano et al.
2002/0019117 A1    2/2002    Nagasawa

FOREIGN PATENT DOCUMENTS

| JP | 11-181567 | 7/1999 |
| JP | 2000-178740 | 6/2000 |
| JP | 2002-57109 | 2/2002 |

*Primary Examiner*—Leonardo Andujar
(74) *Attorney, Agent, or Firm*—Oblon, Spivak, McClelland, Maier & Neustadt, P.C.

(57) ABSTRACT

Provided are a semiconductor and semiconductor substrate exhibiting low resistance on the substrate side while exhibiting high resistivity in an epitaxially grown layer formed thereover; a method of manufacturing the same; and a semiconductor device employing this semiconductor. The semiconductor consists of a compound single crystal and comprises a region having a planar defect density of $1 \times 10^7/\text{cm}^2$ or more and a region having a planar defect density of $1/\text{cm}^2$ or less. The semiconductor substrate comprises the aforementioned semiconductor on a substrate. The methods of manufacturing the aforementioned semiconductor and semiconductor substrate are also provided. The semiconductor device comprises the aforementioned semiconductor, an electrode having at least one ohmic contact, and an electrode having at least one non-ohmic contact, wherein the ohmic contact is formed in the high-density defect region of the aforementioned semiconductor and the non-ohmic contact is formed in the low-density defect region thereof.

26 Claims, 6 Drawing Sheets

SEMICONDUCTOR AND SEMICONDUCTOR SUBSTRATE, METHOD OF MANUFACTURING THE SAME, AND SEMICONDUCTOR DEVICE

FIELD OF THE INVENTION

The present invention relates to semiconductors and semiconductor substrates that can be employed as materials for active semiconductor devices, in particular, for power semiconductor devices and semiconductor light-emitting devices such as LEDs and LDs; methods of manufacturing the same; and semiconductor devices employing these semiconductors. In particular, the present invention relates to semiconductors and semiconductor substrates for obtaining semiconductor devices that exhibit little power loss while affording improved breakdown voltage and light-emitting efficiency; methods of manufacturing the same; and semiconductor devices employing these semiconductors.

BACKGROUND OF THE INVENTION

The breakdown voltage of a semiconductor device is affected by the forbidden energy band gap width (energy band gap), critical breakdown field, and depletion layer width of the semiconductor serving as the material. The wider the band gap width and the higher the critical breakdown field of the semiconductor employed as the material, the greater the breakdown voltage of the semiconductor device obtained. Further, even for an identical critical breakdown field, the greater the depletion layer width formed in the active region, the greater the breakdown voltage. Since the width of the depletion layer is inversely proportional to the square root of the concentration of impurities such as donors and acceptors that are added to the active region, impurities have been added to adjust the breakdown voltage (see Japanese Unexamined Patent Publication (KOKAI) No. 2002-57109). Usually, in semiconductor devices requiring an increased breakdown voltage, the concentration of impurities added to the active region is reduced.

However, since the resistivity of a semiconductor is inversely proportional to the concentration of impurities, the higher the breakdown voltage of a semiconductor device, the greater the tendency for the resistance (specific on resistance) within the device in an ON state to be higher. An increase in ON resistance causes increase in power loss and corresponding heat generation. Accordingly, reducing the power loss within a device while increasing the breakdown voltage requires the use of a semiconductor substrate with a wide band gap and a high critical breakdown field. Thus, instead of silicon (Si) that is widely employed as a semiconductor substrate, the use of semiconductor materials with wide band gaps, such as silicon carbide (SiC) and gallium nitride (GaN), as materials of power semiconductor devices has begun.

As mentioned above, the wider the band gap of a semiconductor device, the greater the advantage afforded in increasing the breakdown voltage and reducing specific on resistance. Conversely, widening of the band gap width makes it hard to achieve a ohmic contact electrode (ohmic electrode) and reduce contact resistance. For example, in a Schottky barrier diode (SBD), a low concentration of impurity is added in the vicinity of the Schottky contact to widen the depletion layer, and a high concentration of impurity is added in the vicinity of the ohmic contact to reduce the contact resistance. In principle, the thickness of the semiconductor device should just be about the width of the depletion layer that can be ensure the desired resistant voltage, and is generally 10 µm or less. However, since it is necessary to increase mechanical strength, a low concentration layer of about 10 µm is formed on the low resistance substrate of several hundred microns, and a Schottky contact is formed on the surface thereof. Accordingly, when manufacturing power semiconductor devices with high uniformity and controllability, the concentration and thickness uniformity of the low concentration layer formed on the substrate are important. Further, in order to reduce specific on resistance as low as possible, it is necessary to increase the doping concentration of the substrate as high as possible.

In order to obtain an active layer with a high breakdown voltage, it is necessary to form a homoepitaxial layer with high resistivity. However, when anti-phase boundaries, stacking faults, and small-angle grain boundaries are present in this epitaxial layer, they act as a source of electrons and holes, making it difficult to achieve a prescribed breakdown voltage. Thus, the ELO method, undulation method, and the like are employed to reduce defects (see Japanese Unexamined Patent Publication (KOKAI) No. 2000-178740). However, even when employing one of the above-mentioned methods, it is necessary to process the substrate surface prior to growing the epitaxial layer. Further, with the ELO method, planar defects end up remaining in merged regions between crystals, and current may leak out through the defects. Further, with the undulation method, since statistical symmetry of slope must be maintained during processing and the reduction in crystalline defects is inversely proportional to the film thickness, complete elimination of planar defects is impossible.

Accordingly, it is an object of the present invention to provide a semiconductor and semiconductor substrate exhibiting low resistivity on the substrate side while exhibiting high resistivity in an epitaxially grown layer formed thereover; a method of manufacturing the same; and a semiconductor device employing this semiconductor.

SUMMARY OF THE INVENTION

The aforementioned object can be achieved by the following means:

(1) a semiconductor which consists of a compound single crystal and comprises a region (referred to as "high-defect-density region", hereinafter) having a planar defect density of $1 \times 10^7/cm^2$ or more and a region (referred to as "low-defect-density region", hereinafter) having a planar defect density of $1/cm^2$ or less;

(2) the semiconductor according to (1), wherein the high-density defect region has an electron concentration of 10 times or more of that of the low-defect-density region at room temperature;

(3) the semiconductor according to (1) or (2), wherein the semiconductor has a plate shape having at least one pair of opposite surfaces that are roughly parallel, on one surface (referred to as "high-defect-density surface", hereinafter) of which, the high-defect-density region is exposed, and, on the other surface (referred to as "low-defect-density surface", hereinafter) of which, the low-defect-density region is exposed;

(4) the semiconductor according to any of (1) to (3), wherein the planar defect is at least one of anti-phase boundary, stacking fault, and small-angle grain boundary;

(5) the semiconductor according to any of (1) to (4), wherein the compound single crystal is a group IV-IV compound single crystal, a group III-V compound single crystal, or a group II-VI compound single crystal;

(6) the semiconductor according to any of (1) to (5), wherein the compound single crystal is a cubic type crystal;

(7) the semiconductor according to any of (1) to (6), wherein the semiconductor has a transition region, between the high-defect-density region and the low-defect-density region, having a thickness of 5 μm or less and a gradient of defect density of $4 \times 10^9/cm^3$ or more;

(8) a semiconductor substrate, wherein the semiconductor according to any of (1) to (7) is provided on a substrate;

(9) the semiconductor substrate according to (8), wherein the semiconductor comprises a high-defect-density region and a low-defect-density region in this order on a substrate;

(10) a method of manufacturing the semiconductor according to any of (1) to (7) or the semiconductor substrate according to (8) or (9), in which a compound single crystal is grown on a substrate using liquid phase or vapor phase, and the method comprises the steps of;

growing a compound single crystal having a planar defect at a density of $1 \times 10^7/cm^2$ or more on the surface of the growth substrate (referred to as "step (A)", hereinafter), and growing a compound single crystal in an orientation differing from an orientation of propagation of the planar defect exposed on the surface of the compound single crystal grown in the step (A) to form a compound single crystal layer having a planar defect density of $1/cm^2$ or less (referred to as "step (B)", hereinafter);

(11) the method according to (10), wherein the step (A) is carried out by generating a planar defect at a density of $1 \times 10^7/cm^2$ or more on the surface of the substrate as well as constantly exposing the planar defect on the surface to propagate the structure of the planar defect;

(12) the method according to (10) or (11), wherein, following forming the compound single crystal layer having a planar defect density of $1/cm^2$ or less, the growth substrate is removed to obtain the semiconductor according to any of (1) to (7);

(13) a semiconductor device comprising an electrode having at least one ohmic contact and an electrode having at least one non-ohmic contact, wherein the ohmic contact is formed in the high-density defect region of the semiconductor according to any of (1) to (7) and the non-ohmic contact is formed in the low-density defect region thereof.

The semiconductor of the present invention is characterized by consisting of a compound single crystal and comprising a high-defect-density region having a planar defect density of $1 \times 10^7/cm^2$ or more and a low-defect-density region having a planar defect density of $1/cm^2$ or less. Further, the semiconductor of the present invention may also be a semiconductor that has a plate shape having at least one pair of opposite surfaces that are roughly parallel, on one surface (high-defect-density surface) of which, the high-defect-density region having a planar defect density of $1 \times 10^7/cm^2$ or more is exposed, and, on the other surface (low-defect-density surface) of which, the low-defect-density region having a planar defect density of $1/cm^2$ or less is exposed.

The present invention also relates to a semiconductor substrate wherein the semiconductor of the present invention is provided on a substrate.

By having a region with a high concentration of electrically conductive planar defects (high-defect-density region), the semiconductor of the present invention permits the obtaining of a ohmic contact with low resistance irrespective of the impurities incorporated.

Further, by having a region with a low concentration of planar defects (low-defect-density region) imparting a reduction in breakdown voltage and an increase in leak current, the semiconductor of the present invention permits the obtaining of a power semiconductor device affording a high breakdown voltage keeping high efficiency. In particular, since planar defects can be reduced or eliminated not by annihilation of planar defects in the semiconductor of the present invention, planar defects can be reduced if the film thickness becomes thinner.

Accordingly, the interface between the low resistivity region (high-defect-density region) and the high resistivity region (low-defect-density region) can be made steep, and it is also possible to fabricate power semiconductor devices of high controllability and uniformity since impurities do not diffuse to the out-side and the memory effect during growth does not occur. Further, since an ohmic contact is obtained through defects, an advantage is afforded in that there is less dependence on temperature.

The planar defect density in the high-defect-density region is $1 \times 10^7/cm^2$ or more, preferably $1 \times 10^9/cm^2$ or more, and more preferably $1 \times 10^{10}/cm^2$ or more. When the planar defect density is less than $1 \times 10^7/cm^2$, the resistivity of the region containing defects does not become one tenth or less of that of the region not containing defects, and the specific on resistance of the device does not decrease.

The planar defect density in the low-defect-density region is $1/cm^2$ or less, preferably $0.1/cm^2$ or less, and more preferably $0.01/cm^2$ or less. When the planar defect density exceeds $1/cm^2$, the leakage current in that region increases, precluding the achievement of good device characteristics.

The planar defect density can be measured as follows;
etch-pits are formed on spots on the surface of which defects has been exposed by etching using molten KOH or the like, and then the number of these etch pits is counted using a microscope to measure the planar defect density.

In the semiconductor of the present invention, the high-density defect region preferably has an electron concentration of 10 times or more, more preferably 100 times or more of that of the low-defect-density region at room temperature. When the high-density defect region has an electron concentration of 10 times or more of that of the low-defect-density region at room temperature, the specific on resistance of the device can be decreased.

The electron concentration can be calculated by using the four proves method to obtain resistivity ρ, using the Hall effect to obtain the electron mobility μ, and then calculating:

Electron density $n = 1/(e \cdot \rho \cdot \mu)$.

The semiconductor of the present invention can be comprised of a group IV-IV compound single crystal, a group III-V compound single crystal, or a group II-VI compound single crystal. Specific examples are compound single crystals such as GaAs, AlAs, InAs, GaP, GaSb, InP, InSb, ZnS, ZnSe, CdS, CdTe, and HgTe. Further, the semiconductor of the present invention is preferably a crystal having planar defects extending in a plane not perpendicular to the orientation of crystal growth. Cubic crystals are examples of such crystals. Examples of the compound single crystals constituting the semiconductor of the present invention are cubic silicon carbide (SiC), gallium nitride (GaN), indium phosphide (InP), gallium arsenide (GaAs), indium arsenide (InAs), aluminum arsenide (AlAs), and alloy crystals thereof.

The planar defect contained in the semiconductor of the present invention can be at least one of anti-phase boundary (APB), stacking fault (SF), and small-angle grain boundary (SAGB). In a compound semiconductor crystal, such planar defects locally disrupt electrically neutral conditions, causing an increase in the concentration of carriers such as electrons and holes. Accordingly, since the same effect as in the case of addition of a high concentration of impurities can be achieved by increasing in the concentration of such defects, planes having such planar defects are suitable as a plane on the substrate side and as an ohmic contact layer.

In the semiconductor of the present invention, the boundary between the low resistivity region (high-defect-density region) and the high resistivity region (low-defect-density region) can be set as desired only with the crystal growth step. Based on the position at which the boundary is inserted, the breakdown voltage of the device can be set as desired. The gradient of the crystal defect density is preferably $4 \times 10^7/cm^3$ or more.

In the semiconductor of the present invention, the breakdown voltage and resistivity of the device can be readily set by forming a region in which the planar defect density greatly changes at a desired position. Further, it is possible to obtain a low resistance contact layer and a low-defect-density high resistivity active layer only with a process of manufacturing a semiconductor substrate without an impurity addition step such as ion implantation or thermal diffusion, permitting enhanced yields and cost reductions.

The method of manufacturing the semiconductor of the present invention will be described in greater detail below.

The semiconductor of the present invention can be obtained by sequentially epitaxially growing, on a growth substrate, two or more layers consisting of a compound single crystal either identical to or different from a compound single crystal constituting the substrate from vapor phase or liquid phase.

In the present invention, a high-defect-density region having a planar defect of $1 \times 10^7/cm^2$ or more can be formed on a growth substrate by growing a single crystal having a lattice constant different from that of the single crystal constituting the growth substrate. Further, by skewing the normal axis of the growth substrate to a specific orientation (for example, [110] orientation) relative to a specific crystal plane (for example, (001) face), it is possible to converge planar defects in a single direction and, independent on the film thickness, cause the planar defects to propagate in parallel at a density of $1 \times 10^7/cm^2$ or more. Thus, it is possible to grow a crystal while constantly exposing the planar defect on the surface to propagate the structure of the planar defect.

When intentionally increasing supersaturation in the course of growing a crystal (for example, in vapor phase growth, abruptly increasing in the concentration of starting materials or abruptly decreasing the substrate temperature), the nucleation probability increases and spontaneous nucleation growth occurs. Subsequently, when crystal growth is conducted until adjacent nuclei merge together, planar defects form at those interfaces. Accordingly, the planar defect density can be controlled by changing the supersaturation. Thus, changing the supersaturation when growing crystals permits the formation of a layer with a planar defect density of $1 \times 10^7/cm^2$ or more on a substrate.

In the present invention, a low-defect-density region having a planar defect of $1/cm^2$ or less can be formed by growing a base crystal in an orientation differing from an orientation of propagation of the structure of the planar defect exposed on the surface of the aforementioned high-defect-density region to terminate the propagation of planar defect on the growth surface. In particular, the angle between the orientation of the planar defect propagation and the orientation of the base crystal propagation is preferably 10 degrees or more. When this angle is 10 degrees or more, the planar defects are sealed off over as limited a region as possible, and it is possible to terminate the planar defects. For this, for example, it is possible to employ a method of processing the film surface during growth to render it uneven, and then growing a base crystal in an orientation differing from an orientation of the planar defect propagation, or to employ a method of selectively forming on the surface of the planar defects a mask obstructing the propagation of the planar defects. Specific examples of methods that can be employed are forming facets, undulations, or groove-like holes, or etch-pits on the surface of the high-defect-density region. When stacking a single crystal on a surface that has been imparted with facets or the like, it is possible to gradually eliminate the difference in height of the facets or the like to obtain a smooth mirror surface on a single crystal layer at a thickness of about 100 µm. Accordingly, since the step density decreases when the thickness becomes even greater, growth by two-dimensional nucleation can be occurred.

In the present invention, it is possible to directly provide a low-defect-density region on a high-defect-density region. In addition, it is also possible to provide a region (transition region) having a gradient of defect density of $4 \times 10^9/cm^3$ or more between the high-defect-density region and the low-defect-density region. The transition region preferably has a thickness of 5 µm or less, more preferably 1 µm or less. In this case, it is possible to form facets or the like on the high-defect-density region followed by growing a crystal to form a transition region, and then form facets or the like on the surface of the transition region followed by growing a crystal to form a low-defect-density surface.

The gradient of defect density can be obtained as a change in the etch-pit density (differential value) relative to the amount of grinding by counting the number of etching pits while gradually grinding the surface.

There are numerous examples of methods of forming facets, undulations, and the like, such as photolithographic techniques, press processing techniques, laser processing techniques, ultrasonic processing techniques, and grinding techniques. In any methods employed, the planar defect propagating in the high-defect-density region should just have a shape sufficient to be reduced or eliminated effectively in the low-defect-density region. When employing photolithography, facets or the like of a desired shape can be transferred to the surface of the high-defect-density surface by forming a mask pattern to be transferred to the surface of the high-defect-density surface as desired. For example, by varying the line width of the pattern, it is possible to control the width of the shape of facets or the like. Further, by controlling the selectivity of etching ratio between a resist and a substrate, it is possible to control the depth and angle of slope thereof. Even when a rectangular pattern is undesirable, it is possible to transfer a pattern to a resist, reflow of the resist by heating, and form a wave-shaped pattern. When employing a press processing technique, it is possible to form facets or the like of a desired shape on the growth surface by forming a pressing mold to a desired shape. By forming molds of various shapes, it is possible to form facets or the like of various shapes on the growth substrate. When employing a laser processing or ultrasonic processing technique, since it is possible to directly form a shape such as a facet on the substrate, more minute processing is possible. When grinding processing is employed, varying the size of abrasives and pressure of the grinding makes it possible to control the width and depth of the undulating shape. When forming facets or undulations in only one direction, grinding is conducted in only one direction.

To achieve a planar defect density of $1/cm^2$ or less in the low-defect-density region, the edge of the facets should be as close as possible to parallel to the planar defects, and the planar defects are desirably positioned at the bottom of the facets. In the subsequent growth, conditions causing the facets to grow to the direction as close as possible to perpendicular to the normal direction of the substrate are desirably employed. Further, adjacent facets are desirably opposed.

The method of forming a high-defect-density region on a growth substrate and then forming a low-defect-density region during crystal growth has been described. However, the present invention includes the aspect of forming a low-defect-density region and then forming a high-defect-density region. For example, a high-defect-density region can be formed on a low-defect-density region by forming a low-defect-density region on a growth substrate, followed by growing a crystal while greatly altering the crystal growth condition to increase the two-dimensional nucleation probability of planar defects.

The semiconductor of the present invention can be employed after the growth substrate is molten by annealing, for example, and then eliminated following finishing the crystal growth. Alternatively, the semiconductor of the present invention can be employed without eliminating the growth substrate.

The semiconductor of the present invention can be formed by bonding together a high-defect-density film and a low-defect-density film. In this case, for example, OH-groups can be formed on both the low-defect-density surface and high-defect-density surface by the treatment with hydrogen peroxide and sulfuric acid, the two surfaces can then be adhered by Van der Waals forces, and then a heat treatment of 1,600° C. or more can be applied, for example, to diffuse the O atoms at the interface, yielding a strong continuous interface.

A semiconductor device comprising an electrode having at least one ohmic contact and an electrode having at least one non-ohmic contact can be obtained by forming the ohmic contact in the high-density defect region of the semiconductor of the present invention and forming the non-ohmic contact in the low-density defect region thereof. Examples of semiconductor devices employing the semiconductor of the present invention are Schottky barrier diodes, MOS-FETs, MES-FETs, IGBTs, GTOs, thyristors, pressure sensors, UV sensors, and infrared sensors.

EXAMPLES

The present invention is described more specifically below through Examples. However, the present invention is not limited to these Examples.

Example 1

Figure 1:
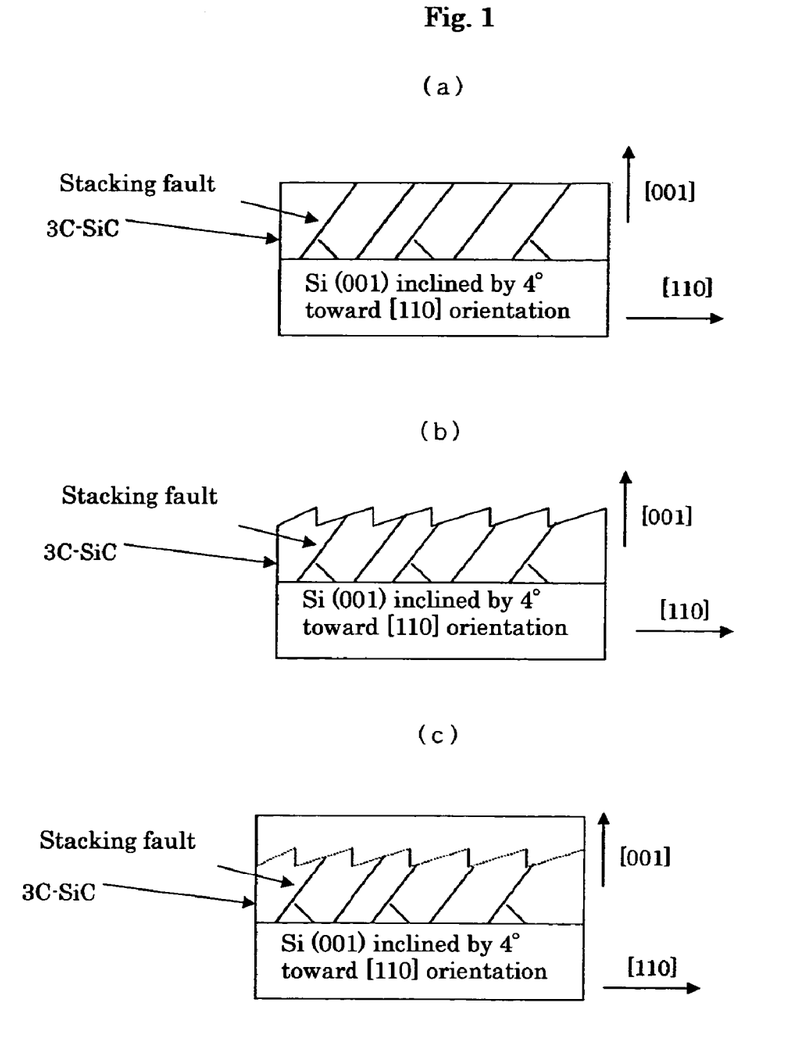
FIG. 1 is a schematic of crystal growth in Example 1.

Cubic silicon carbide (3C-SiC) was heteroepitaxially grown under the conditions given in Table 1 on a Si (001) substrate having a normal axis inclined by 1 to 4° toward [110] orientation. In this process, although high density stacking faults generated at the 3C-SiC/Si interface due to a difference in lattice constants, the stacking faults were converged in a single direction by the effect of the incline of the normal axis, and irrespective of thickness, the stacking faults propagated parallel to (111) face at a density of $1 \times 10^7$ to $1 \times 10^{10}/cm^2$. The distribution of stacking faults in this process is schematically shown in FIG. 1(a). Although impurities were not added to the growth layer, it exhibited a resistivity of 0.001 Ω-cm or less due to the effect of electrical conductivity caused by stacking faults.

TABLE 1

| SiC growth condition in Example 1 | |
|---|---|
| Temperature of substrate | 1320° C. |
| Pressure | 1.3 Torr |
| $SiH_4$ flow rate | 50 sccm |
| $C_3H_8$ flow rate | 34 sccm |
| $H_2$ flow rate | 3 slm |

Facets inclined by 4 to 8° toward [−1, −1, 0] orientation were formed in a manner covering the growth surface (FIG. 1(b)). The facets were formed at a spacing of 70 μm and processing was conducted to yield a sawtooth shaped cross-section. The height of irregularities of the cross-section were about 5 μm. Partial grinding with diamond abrasives was conducted to form facets. 3C-SiC was then again grown on this surface under the conditions shown in Table 1 (secondary growth). This secondary growth yielded transverse crystal growth to [−1, −1, 0] orientation, and, as shown in FIG. 1(c), propagation of planar defects parallel to (111) face was blocked by the base crystal growing to [−1, −1, 0] orientation, eliminating stacking faults with a density gradient of $2 \times 10^9/cm^3$ or more. Further, the thickness of the region in which the stacking faults was terminated was limited to equal to or less than 5 μm, that is a height of facet irregularities. Differential Hall measurements revealed a secondary growth layer resistivity of 130 Ω-cm.

Figure 2:
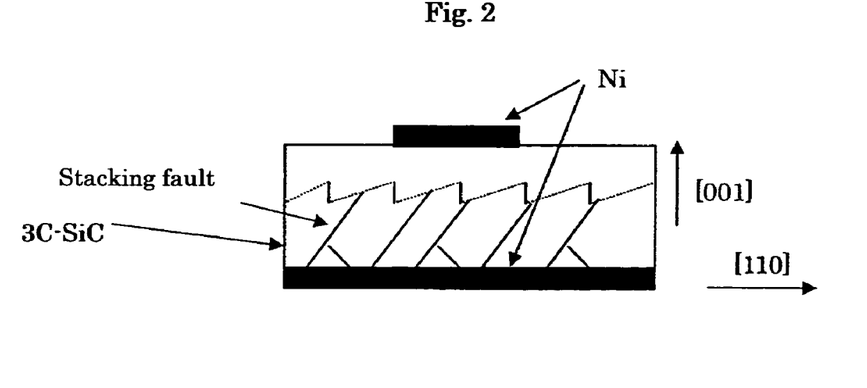
FIG. 2 is a Schottky barrier diode prepared in Example 1.

Finally, the Si substrate was selectively eliminated with a $HF+HNO_3$ solution to obtain free-standing 3C-SiC. The electron concentration of the high-defect-density region of this semiconductor was $10^{19}/cm^3$ and the electron concentration of the low-defect-density region was $10^{15}/cm^3$. Next, Ni was evaporated to a thickness of 3,000 Å over the entire initially grown surface (the surface that had been in contact with the Si substrate up to this point), and a Ni electrode 3,000 Å in thickness with a diameter of 300 μm was formed on the surface that had been subjected to secondary growth (FIG. 2). The Ni electrode on the initially grown surface side exhibited ohmic characteristics. It had a contact resistance of $1 \times 10^{-7}/cm^2$. Further, the Ni electrode of the secondary growth surface exhibited non-ohmic characteristics; it exhibited a barrier height of 1.2 eV. The breakdown voltage of the device varied with the thickness of the secondary growth layer. As shown in Table 2, the Schottky barrier diode produced by the present method, despite not having an impurity profile, permitted control of the breakdown voltage through the thickness of the secondary growth layer.

TABLE 2

Relation between secondary growth layer thickness and breakdown voltage

| Thickness of secondary growth layer (μm) | Breakdown voltage (V) |
| --- | --- |
| 2 | 3 |
| 3 | 39 |
| 4 | 83 |
| 5 | 120 |
| 7 | 470 |
| 10 | 690 |
| 15 | 720 |
| 19 | 720 |
| 25 | 720 |
| 30 | 720 |

Example 2

Figure 3:
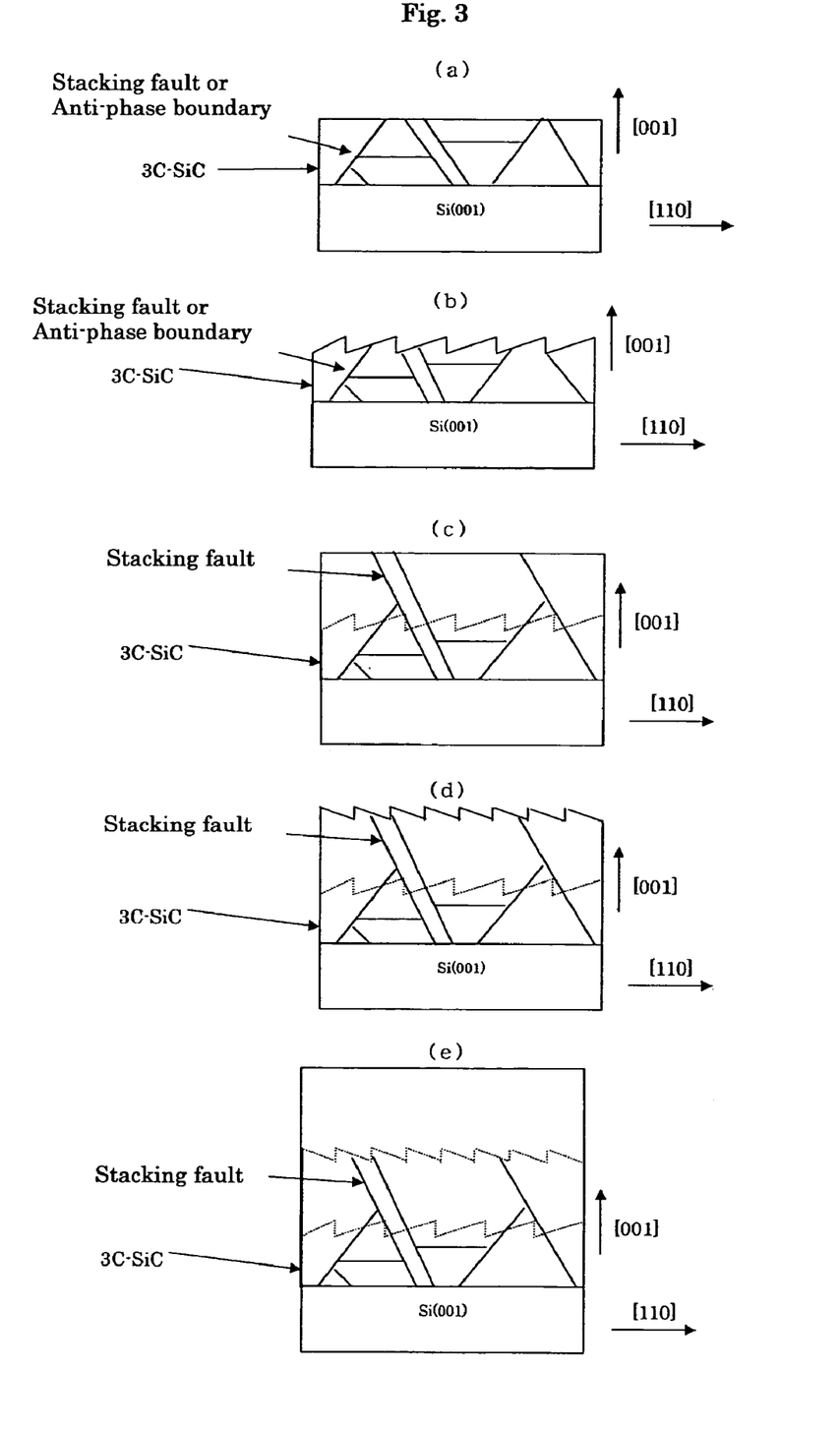
FIG. 3 is a schematic of crystal growth in Example 2.

3C-SiC was grown on a Si (001) substrate under the conditions in Table 1. In the initial growth, antiphase boundaries and stacking faults propagating parallel to {111} faces occurred (FIG. 3(a)). The density of the stacking faults and antiphase boundaries varied with the thickness of the 3C-SiC, and it was $7 \times 10^8/cm^2$ for a thickness of about 100 μm. Subsequently, using the same means as in Example 1, facets inclined by 4° toward [−110] orientation were provided on the surface. The facets were formed at a spacing of 70 μm and processed to form a sawtooth-shaped cross-section (FIG. 3(b)). The height of irregularities of the cross-section were about 5 μm. When 3C-SiC was subsequently grown again to 100 μm, transverse growth to [−1,−1,0] orientation was imparted to the crystal by the effect of the inclined surface, the antiphase boundaries were eliminated, the stacking faults were converged into [−1, −1, 0] orientation, and the density became $3 \times 10^8/cm^2$ at an outermost surface. However, since all the stacking faults were parallel to (−1, −1, 1) face, the density of the stacking faults did not diminish even when the film thickness was made thicker (FIG. 3(c)). The same method as set forth above was then employed to form facets inclined by 4° toward [110] orientation over the entire growth surface (FIG. 3(d)). The facets were formed at a spacing of 70 μm and processed to form a sawtooth-shaped cross-section. The height of irregularities of the cross-section were about 5 μm. 3C-SiC was again grown on this surface (tertiary growth), imparting transverse crystal growth to [110] orientation due to the effect of the inclined surface, terminating the stacking faults (FIG. 3(e)). The thickness of the region in which the stacking faults were terminated was 5 μm or less. The gradient of planar defect density was $6 \times 10^{11}/cm^3$. The electron concentration of the high-defect-density region of this semiconductor was $10^{19}/cm^3$, and the electron concentration of the low-defect-density region was $10^{15}/cm^3$. Differential Hall measurement revealed the resistivity of the tertiary growth layer to be 130 Ω-cm. Further, as is also clear from the results of Example 1, when a diode was prepared from the semiconductor of the present Example, it was possible to control the breakdown voltage of the diode through the thickness of the tertiary growth layer.

Example 3

Figure 4:
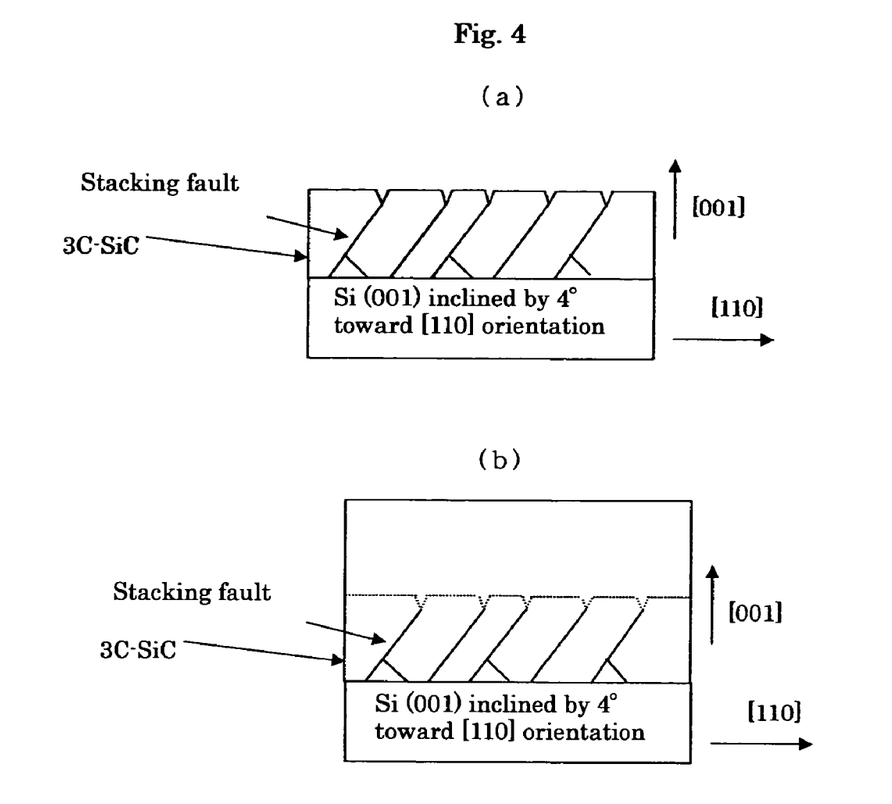
FIG. 4 is a schematic of crystal growth in Example 3.

Cubic silicon carbide (3C-SiC) was heteroepitaxially grown under the conditions in Table 1 on a Si (001) substrate having a normal axis inclined by 1 to 4° toward [110] orientation. In this process, high-density stacking faults occurred at the 3C-SiC/Si interface due to a difference in lattice constants. However, the stacking faults were converged in a single direction due to the effect of the incline of the normal axis, propagating in parallel to (111) face with a density of $1 \times 10^7$ to $1 \times 10^{10}/cm^2$ irrespective of film thickness. The distribution of the stacking faults in this process was as shown in FIG. 1(a). When the growth surface was etched for 10 min with molten KOH at 500° C., the surface layer of the stacking fault portion was etched by about 5 μm, forming groove-shaped holes (FIG. 4(a)). 3C-SiC was again grown on this surface (secondary growth) under the conditions in Table 1. This secondary growth imparted transverse crystal growth to [−1,−1,0] and [110] orientations in the grooves. As shown in FIG. 4(b), planar defect propagation parallel to (111) face was blocked by the base crystal growing to [−1,−1,0] and [110] orientations, eliminating stacking faults at a density gradient of $2 \times 10^9/cm^3$ or more. Further, the thickness of the region in which the stacking faults were terminated was limited to equal to or less than 5 μm, that was a depth of the grooves. The electron concentration of the high-defect-density region of this semiconductor was $10^{19}/cm^3$ and the electron concentration of the low-defect-density region was $10^{15}/cm^3$. Differential Hall measurement revealed the resistivity of the secondary growth layer to be 130 Ω-cm. As is also clear from the results of Example 1, when a diode was made from the semiconductor of the present example, it was possible to control the breakdown voltage of the diode through the thickness of the secondary growth layer.

Example 4

Figure 5:
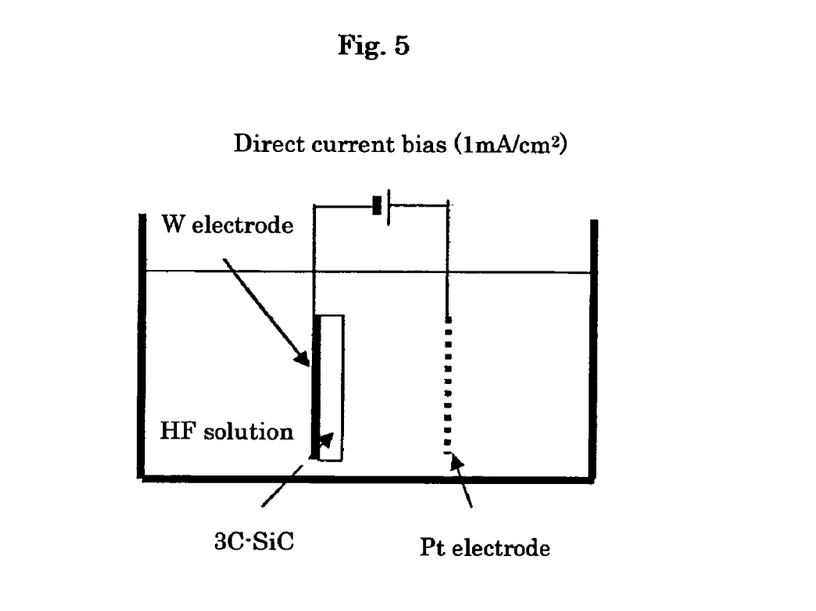
FIG. 5 is a summary of etching in Example 4.
Figure 6:
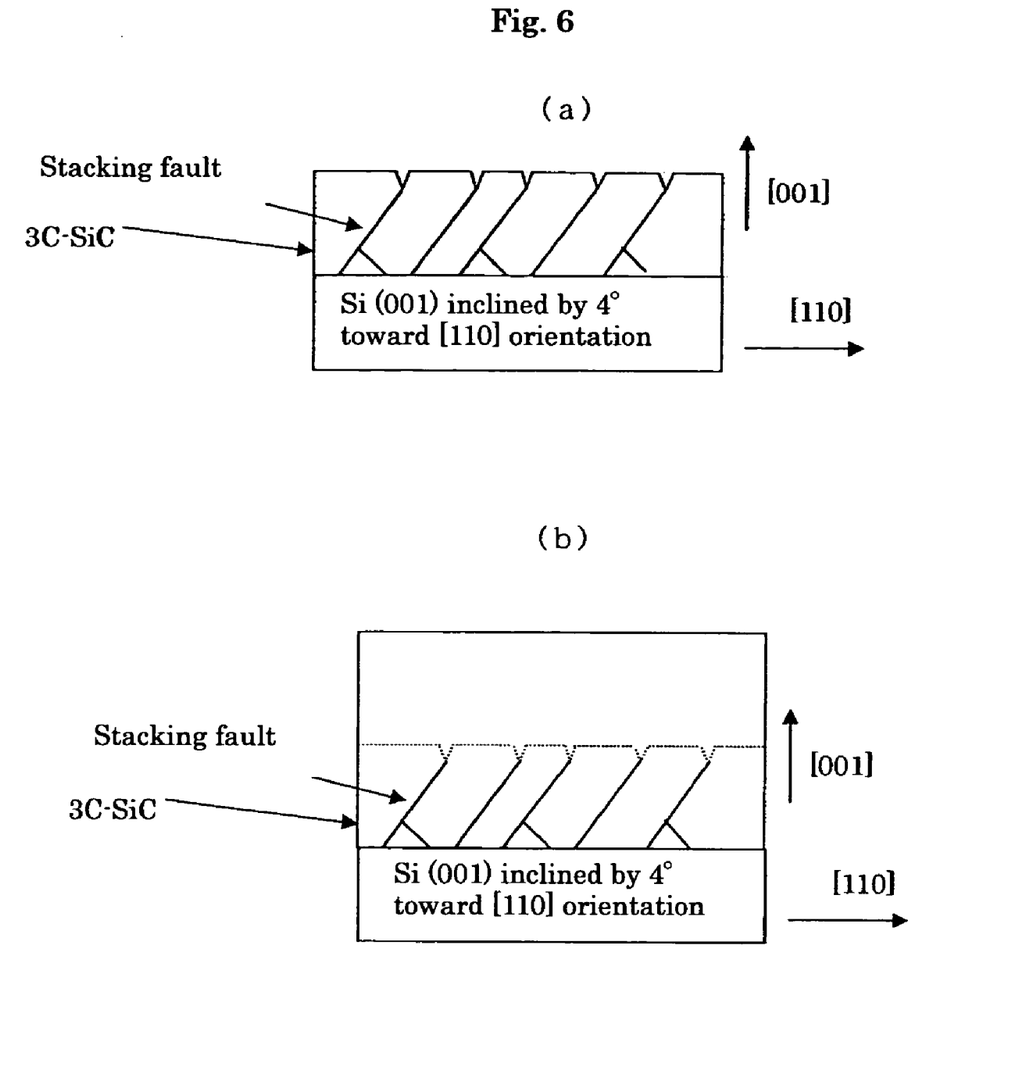
FIG. 6 is a schematic of crystal growth in Example 4.

Cubic silicon carbide (3C-SiC) was heteroepitaxially grown under the conditions in Table 1 on a Si (001) substrate having a normal axis inclined by 1 to 4° toward [110] orientation. In this process, high-density stacking faults occurred at the 3C-SiC/Si interface due to a difference in lattice constants. However, the stacking faults were converged in a single direction due to the effect of the incline of the normal axis, propagating in parallel to the (111) face with a density of $1 \times 10^7$ to $1 \times 10^{10}/cm^2$ irrespective of film thickness. The distribution of the stacking faults in this process was as shown in FIG. 1. Next, the Si substrate was selectively etched away with a HF+HNO$_3$ solution to obtain free-standing 3C-SiC. W was then vapor-deposited to a thickness of 3,000 Å over the entire surface of the initially grown surface (the surface that had been in contact with the Si substrate up to this point). Next, the 3C-SiC substrate was immersed in 50% HF solution, an opposing Pt mesh electrode was provided at a spot 1 cm away from the surface. The rear surface W electrode was made the cathode, the Pt electrode was made the anode, and DC current was made to flow with a current density of 1 mA/cm$^2$ to etch the 3C-SiC surface (FIG. 5). In the course of etching, the stacking fault portions served as current passages, causing only top portions of the stacking faults to be selectively etched. Ten minutes of etching formed roughly 10 μm groove-like etch-pits (FIG. 6(a)). Subsequently, a mixed solution of potassium ferricyanide and KOH was used to remove the W electrode on the rear side, and 3C-SiC was homoepitaxially grown under the conditions of Table 1 (secondary growth). This secondary growth imparted transverse crystal growth to [−1,−1,0] and [110] orientations in the grooves. As shown in FIG. 6(b), planar defect propagation parallel to (111) face was blocked by the base crystal growing to [−1,−1,0] and

[110] orientations, eliminating stacking faults at a density gradient of $2\times10^9/cm^3$ or more. Further, the thickness of the region in which the stacking faults were terminated was limited to equal to or less than 5 µm, that was a depth of the grooves. The electron concentration of the high-defect-density region of this semiconductor was $10^{19}/cm^3$ and the electron concentration of the low-defect-density region was $10^{15}/cm^3$. Differential Hall measurement revealed the resistivity of the secondary growth layer to be 130 Ω-cm. As is also clear from the results of Example 1, when a diode was made from the semiconductor of the present example, it was possible to control the breakdown voltage of the diode through the thickness of the secondary growth layer.

Example 5

Figure 7:
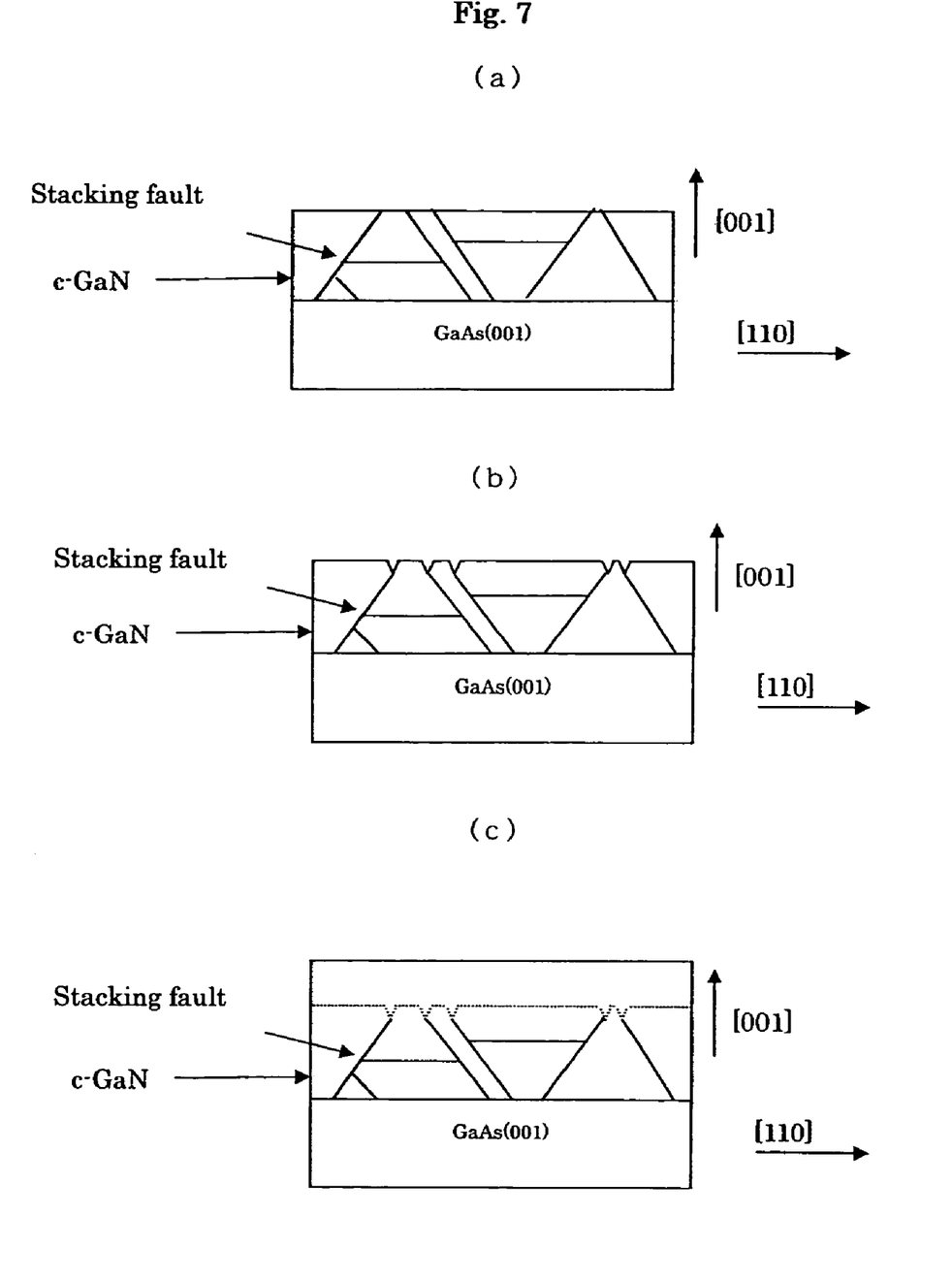
FIG. 7 is a schematic of crystal growth in Example 5.

A Cold-wall type MOCVD system was employed to heteroepitaxially grow cubic gallium nitride (c-GaN) to a thickness of 30 µm on a GaAs (001) substrate under the conditions of Table 3. In this process, high-density stacking faults generated due to a difference in lattice constants at the c-GaN/GaAs interface (FIG. 7(a)). In this case, the stacking fault density was $3.5\times10^9/cm^2$.

TABLE 3

| SiC growth condition in Example 5 | |
|---|---|
| Temperature of substrate | 1200° C. |
| Pressure | 1.5 Torr |
| HN₃ flow rate | 50 sccm |
| TMG flow rate | 5 sccm |
| H₂ flow rate | 1 slm |

Figure 8:
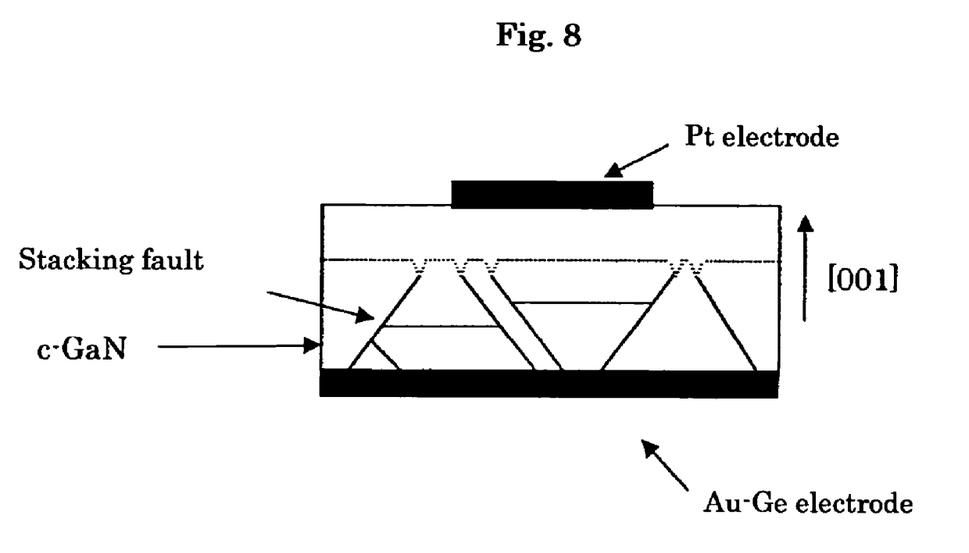
FIG. 8 is a Schottky barrier diode prepared in Example 5.

Next, the substrate was immersed in hot phosphoric acid to selectively etch the stacking fault portion. A 30 min period of etching with hot phosphoric acid produced roughly 5 µm etch-pits (FIG. 7(b)). c-GaN was then homoepitaxially grown again under the conditions shown in FIG. 3 (secondary growth). In this process, since the sidewalls of the etch-pits grew in a transverse direction to [110] orientation, the propagation of stacking faults parallel to {111} faces was terminated and the stacking fault density became zero in a region of equal to or less than 5 µm, that was a depth of etch-pits (FIG. 7(c)). The density gradient of the stacking faults was $7\times10^{12}/cm^3$. The electron concentration of the high-defect-density region of this semiconductor was $4\times10^{18}/cm^3$ and the electron concentration of the low-defect-density region was $8\times10^{14}/cm^3$. Subsequently, annealing was conducted for one hour at 1,200° C. to melt and remove the GaAs substrate. Finally, a Ge-doped Au electrode was formed over the entire surface formed on the GaAs substrate side, and a Pt electrode 3,000 Å in thickness and 300 µm in diameter was formed on the side where the secondary growth had been conducted (FIG. 8). The Au electrode on the GaAs substrate side exhibited ohmic characteristics, having a contact resistance of $1.4\times10^{-8}/cm^2$. Further, the Pt electrode on the secondary growth surface exhibited non-ohmic characteristics, having a barrier height of 0.54 eV. The breakdown voltage of the device varied with the thickness of the secondary growth layer. As shown in Table 4, the Schottky barrier diode prepared by this method, despite not having an impurity profile, permitted the control of the breakdown voltage through the thickness of the secondary growth layer.

TABLE 4

| Relation between secondary growth layer thickness and breakdown voltage | |
|---|---|
| Thickness of secondary growth layer (µm) | Breakdown voltage (V) |
| 1 | 0.5 |
| 2 | 3 |
| 3 | 21 |
| 4 | 58 |
| 5 | 141 |
| 7 | 240 |
| 10 | 270 |

Although the examples of 3C-SiC and c-GaN have been described in Examples above, the present invention is not limited to compound semiconductors thereof, and is effective for group IV-IV compound single crystals, group III-V compound single crystals, and group II-VI compound single crystals. The type of defect is not limited to stacking faults; the same effect can be achieved with antiphase boundaries and small-angle grain boundaries, so long as crystal growth to an orientation differing from the propagation orientation of the defects is used to block defect propagation. The growth method is not limited to vapor phase growth; the same effect can be achieved by liquid phase growth.

According to the present invention, provided are a semiconductor having a high breakdown voltage and being suitable for use in a semiconductor device, and a semiconductor device employing this semiconductor.

The present disclosure relates to the subject matter contained in Japanese Patent Application No. 2002-364009 filed on Dec. 16, 2002, which is expressly incorporated herein by reference in its entirety.

What is claimed is:

1. A semiconductor which consists of a compound single crystal and comprises a region (referred to as "high-defect-density region", hereinafter) having a planar defect density of $1\times10^7/cm^2$ or more and a region (referred to as "low-defect-density region", hereinafter) having a planar defect density of $1/cm^2$ or less, wherein the high-defect-density region has an electron concentration of 10 times or more of that of the low-defect-density region at room temperature.

2. The semiconductor according to claim 1, wherein the semiconductor has a plate shape having at least one pair of opposite surfaces that are roughly parallel, on one surface (referred to as "high-defect-density surface", hereinafter) of which, the high-defect-density region is exposed, and, on the other surface (referred to as "low-defect-density surface", hereinafter) of which, the low-defect-density region is exposed.

3. The semiconductor according to claim 1, wherein the planar defect is at least one of anti-phase boundary, stacking fault, and small-angle grain boundary.

4. The semiconductor according to claim 1, wherein the compound single crystal is a group IV-IV compound single crystal, a group III-V compound single crystal, or a group II-VI compound single crystal.

5. The semiconductor according to claim 1, wherein the compound single crystal is a cubic type crystal.

6. A semiconductor which consists of a compound single crystal and comprises a region (referred to as "high-defect-density region", hereinafter) having a planar defect density of $1\times10^7/cm^2$ or more and a region (referred to as "low-defect-density region", hereinafter) having a planar defect density of $1/cm^2$ or less, wherein the semiconductor has a transition region, between the high-defect-density region and the low-defect-density region, having a thickness of 5 µm or less and a gradient of defect density of $4\times10^9/cm^3$ or more.

7. A semiconductor substrate, wherein a semiconductor is provided on a substrate and said semiconductor consists of a compound single crystal and comprises a region (referred to as "high-defect-density region", hereinafter) having a planar defect density of $1\times10^7/cm^2$ or more and a region (referred to as "low-defect-density region", hereinafter) having a planar defect density of $1/cm^2$ or less, wherein the high-defect-density region has an electron concentration of 10 times or more of that of the low-defect-density region at room temperature.

8. The semiconductor substrate according to claim 7, wherein the semiconductor has a plate shape having at least one pair of opposite surfaces that are roughly parallel, on one surface (referred to as "high-defect-density surface", hereinafter) of which, the high-defect-density region is exposed, and, on the other surface (referred to as "low-defect-density surface", hereinafter) of which, the low-defect-density region is exposed.

9. The semiconductor substrate according to claim 7, wherein the planar defect is at least one of anti-phase boundary, stacking fault, and small-angle grain boundary.

10. The semiconductor substrate according to claim 7, wherein the compound single crystal is a group IV-IV compound single crystal, a group III-V compound single crystal, or a group II-VI compound single crystal.

11. The semiconductor substrate according to claim 7, wherein the compound single crystal is a cubic type crystal.

12. The semiconductor substrate according to claim 7, wherein the semiconductor comprises a high-defect-density region and a low-defect-density region in this order on a substrate.

13. A method of manufacturing the semiconductor according to claim 1 or the semiconductor substrate according to claim 7, in which a compound single crystal is grown on a substrate using liquid phase or vapor phase, and the method comprises the steps of;

growing a compound single crystal having a planar defect at a density of $1\times10^7/cm^2$ or more on the surface of the growth substrate(referred to as "step (A)", hereinafter), and growing a compound single crystal in an orientation differing from an orientation of propagation of the planar defect exposed on the surface of the compound single crystal grown in the step (A) to form a compound single crystal layer having a planar defect density of $1/cm^2$ or less (referred to as "step (B)", hereinafter).

14. The method according to claim 13, wherein the step (A) is carried out by generating a planar defect at a density of $1\times10^7/cm^2$ or more on the surface of the substrate as well as constantly exposing the planar defect on the surface to propagate the structure of the planar defect.

15. The method according to claim 13, wherein, following forming the compound single crystal layer having a planar defect density of $1/cm^2$ or less, the growth substrate is removed to obtain the semiconductor according to claim 1.

16. A semiconductor substrate, wherein a semiconductor is provided on a substrate and said semiconductor consists of a compound single crystal and comprises a region (referred to as "high-defect-density region", hereinafter) having a planar defect density of $1\times10^7/cm^2$ or more and a region (referred to as "low-defect-density region", hereinafter) having a planar defect density of $1/cm^2$ or less, and the semiconductor has a transition region, between the high-defect-density region and the low-defect-density region, having a thickness of 5 µm or less and a gradient of defect density of $4\times10^9/cm^3$ or more.

17. A semiconductor device comprising a semiconductor, an electrode having at least one ohmic contact, and an electrode having at least one non-ohmic contact, wherein the semiconductor consists of a compound single crystal and comprises a region (referred to as "high-defect-density region", hereinafter) having a planar defect density of $1\times10^7/cm^2$ or more and a region (referred to as "low-defect-density region", hereinafter) having a planar defect density of $1/cm^2$ or less, and the ohmic contact is formed in the high-density defect region of the semiconductor and the non-ohmic contact is formed in the low-density defect region of the semiconductor.

18. The semiconductor device according to claim 17, wherein the high-density defect region has an electron concentration of 10 times or more of that of the low-defect-density region at room temperature.

19. The semiconductor device according to claim 17, wherein the semiconductor has a plate shape having at least one pair of opposite surfaces that are roughly parallel, on one surface (referred to as "high-defect-density surface", hereinafter) of which, the high-defect-density region is exposed, and, on the other surface (referred to as "low-defect-density surface", hereinafter) of which, the low-defect-density region is exposed.

20. The semiconductor device according to claim 17, wherein the planar defect is at least one of anti-phase boundary, stacking fault, and small-angle grain boundary.

21. The semiconductor device according to claim 17, wherein the compound single crystal is a group IV-IV compound single crystal, a group III-V compound single crystal, or a group II-VI compound single crystal.

22. The semiconductor device according to claim 17, wherein the compound single crystal is a cubic type crystal.

23. The semiconductor device according to claim 17, wherein the semiconductor has a transition region, between the high-defect-density region and the low-defect-density region, having a thickness of 5 µm or less and a gradient of defect density of $4\times10^9/cm^3$ or more.

24. A semiconductor comprising:

a compound single crystal having a high-defect-density region having a planar defect density of $1\times10^7/cm^2$ or more and a low-defect-density region having a planar defect density of $1/cm^2$ or less, wherein the high-defect-density region has an electron concentration of at least 10 times of an electron concentration of the low-defect-density region at a room temperature.

25. A semiconductor comprising:

a compound single crystal having a high-defect-density region having a planar defect density of $1\times10^7/cm^2$ or more, a low-defect-density region having a planar defect density of $1/cm^2$ or less, and a transition region formed between the high-defect-density region and the low-defect-density region, and having a thickness of 5 µm or less and a gradient of defect density of $4\times10^9/cm^3$ or more.

26. A semiconductor device comprising:

a semiconductor comprising a compound single crystal having a high-defect-density region having a planar defect density of $1\times10^7/cm^2$ or more and a low-defect-density region having a planar defect density of $1/cm^2$ or less;

an ohmic electrode formed in the high-density defect region; and a non-ohmic electrode formed in the low-density defect region.

* * * * *